United States Patent
Brodsky et al.

(10) Patent No.: US 6,838,364 B2
(45) Date of Patent: Jan. 4, 2005

(54) SPUTTERED TUNGSTEN DIFFUSION BARRIER FOR IMPROVED INTERCONNECT ROBUSTNESS

(75) Inventors: Stephen B. Brodsky, Beacon, NY (US); William J. Murphy, Essex Junction, VT (US); Matthew J. Rutten, Milton, VT (US); David C. Strippe, Westford, VT (US); Daniel S. Vanslette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/850,816

(22) Filed: May 8, 2001

(65) Prior Publication Data

US 2001/0029096 A1 Oct. 11, 2001

Related U.S. Application Data

(62) Division of application No. 09/157,012, filed on Sep. 18, 1998, now Pat. No. 6,245,668.

(51) Int. Cl.$^7$ .......................... H01L 21/28; H01L 21/44
(52) U.S. Cl. ...................................... 438/582; 438/627
(58) Field of Search ................................ 438/582, 627, 438/679, 678, 685, 643

(56) References Cited

U.S. PATENT DOCUMENTS

| | | | |
|---|---|---|---|
| 3,900,944 A | 8/1975 | Fuller et al. ................... 29/578 |
| 4,394,678 A | 7/1983 | Winchell, II et al. ......... 357/68 |
| 4,404,235 A | 9/1983 | Tarng et al. ................... 427/89 |
| 4,478,881 A | 10/1984 | Bartur et al. ................. 427/90 |
| 4,532,702 A | 8/1985 | Gigante et al. ............... 29/578 |
| 4,650,696 A | 3/1987 | Raby ............................ 427/89 |
| 4,659,427 A | 4/1987 | Barry et al. ................ 156/643 |
| 4,666,737 A | 5/1987 | Gimpelson et al. .......... 427/89 |
| 4,782,380 A | 11/1988 | Shankar et al. ............... 357/71 |
| 4,804,560 A | 2/1989 | Shioya et al. ............... 427/125 |
| 4,857,481 A | 8/1989 | Tam et al. .................... 437/182 |
| 4,884,123 A | 11/1989 | Dixit et al. ................... 357/71 |
| 4,960,732 A | 10/1990 | Dixit et al. ................. 437/192 |
| 5,008,216 A | 4/1991 | Huang et al. ............... 437/192 |
| 5,227,335 A | 7/1993 | Holschwandner et al. .. 437/192 |
| 5,342,652 A | 8/1994 | Foster et al. ................ 427/253 |
| 5,391,275 A | * 2/1995 | Mintz .................... 204/192.32 |
| 5,434,110 A | 7/1995 | Foster et al. ................ 437/245 |
| 5,434,451 A | 7/1995 | Dalal et al. ................. 257/768 |
| 5,585,673 A | 12/1996 | Joshi et al. ................. 257/751 |
| 5,622,894 A | 4/1997 | Jang et al. .................. 438/643 |
| 5,770,519 A | 6/1998 | Klein et al. ................. 438/639 |
| 5,854,140 A | 12/1998 | Jaso et al. ................... 438/740 |
| 5,953,629 A | * 9/1999 | Imazeki et al. ............. 438/679 |
| 6,197,167 B1 | * 3/2001 | Tanaka .................. 204/192.15 |

FOREIGN PATENT DOCUMENTS

GB          1 094 504 A2 *  4/2001    ......... H01L/21/285

* cited by examiner

Primary Examiner—W. David Coleman
(74) Attorney, Agent, or Firm—DeLio & Peterson, LLC; Kelly M. Reynolds; William D. Sabo

(57) ABSTRACT

A method of forming inter-level contacts or vias between metal layers using a tungsten film deposited into the via using non-collimated sputter deposition. The sputter chamber is configured with a pressure of about 1 mTorr to about 10 mTorr with an inert gas flow of at least 25 cm$^3$/min to about 150 cm$^3$/min. Shielding inside the chamber is coated with a material, preferably, aluminum oxide, that promotes adhesion of tungsten to the shielding. An adhesion layer of titanium may be included prior to deposition of the tungsten film. Non-collimated sputter deposition increases the target to substrate distance inside the sputter chamber; reduces the heating effect associated with traditional collimated sputtering; and provides more robust diffusion barriers.

17 Claims, 3 Drawing Sheets

SPUTTERED TUNGSTEN DIFFUSION BARRIER FOR IMPROVED INTERCONNECT ROBUSTNESS

This is a divisional of application(s) Ser. No. 09/157,012 filed on Sep. 18, 1998 now U.S. Pat. No. 6,245,668.

BACKGROUND OF THE INVENTION

1. Field of the Invention

The present invention relates to semiconductor devices, and more particularly, to a method of sputtering tungsten diffusion barriers in contact and via holes in semiconductor devices having increased robustness.

2. Description of Related Art

In the manufacture of semiconductor devices, metal conductive layers are patterned for the purpose of making interconnections between different points on the device. After formation of this patterned metal conductive layer, an electrically insulative material such as silicon dioxide or silicon nitride is deposited over the metal conductive layer by conventional deposition techniques. The surface of this electrically insulative layer will routinely be uneven due to the uneven underlying contour of the patterned conductive layer. The presence of a metal interconnect path beneath the insulative layer results in a corresponding elevated path in the surface contour of the insulative layer.

Often it is necessary, especially in high density devices, to form additional patterned conductive layers on the surface of the insulative layer. In order to interconnect the metal conductive layers to each other and to the substrate, the generally followed practice is to etch holes in the insulative layer prior to deposition of a metallic layer onto the insulative layer. These holes or "vias" are located in positions where contacts are desired between conductive regions, such as previously deposited patterned metal layers, or conductive substrate layers underlying the insulative layer and metal patterns deposited on the insulative layer. Vias are best visualized as cylinders which are filled with a metal so that devices located on different metallization levels can be electrically connected.

Vias are typically formed by applying a resist mask to the insulative layer. The resist mask is patterned and etched to form openings where via holes are to be etched into the insulative layer. An etchant is then applied to the mask layer such that via holes are etched where openings occur in the etching mask. The etching mask is then removed from the surface of the insulative layer and a metal layer is deposited on the insulative layer.

Prior to deposition of the metal layer the via may be filled with another metal to form a via stud. Such techniques as chemical vapor deposition of tungsten (CVD-W) followed by planarization of the blanket tungsten film may be used to form a tungsten via stud. However, during CVD-W to fill the via, the underlying materials are often attacked by the chemicals used in the CVD process. This requires a robust diffusion barrier to be deposited into the via between the underlying metal, usually aluminum, and the CVD-W chemistry, and to act as an adhesion layer for the CVD-W. Robustness is considered in the industry as encompassing the reliability, quality, and low failure rate of the diffusion barrier. Robustness of the diffusion barrier is important since failure of the barrier films result in attack of the underlying structures and/or defects in the CVD-W stud. Despite significant improvements in the barrier film quality, failure of these barriers is still a serious problem in semiconductor manufacture.

The prior art is replete with the use of diffusion barriers comprising titanium adhesion films alone or with titanium nitride or tungsten films. These films are generally deposited by physical vapor deposition (PVD), also known as sputtering, with the use of a collimator. Sputtering techniques using collimators, or collimation, traditionally give excellent step coverage in high aspect ratio vias by focusing the spray of the sputtered material. However, it has been found that during collimation tremendous energy is created which is transferred to the silicon wafer of the semiconductor device. Temperatures exceeding 420° C. are possible leading to extrusion of the aluminum lines. It is desirable to have a process of depositing diffusion barrier films which does not employ such high temperature or result in aluminum extrusion but still provides robust barrier films and achieves the needed step coverage required in high aspect ratio vias.

Bearing in mind the problems and deficiencies of the prior art, it is therefore an object of the present invention to provide a method of sputter depositing a tungsten diffusion barrier film without employing excessively high temperatures.

It is another object of the present invention to provide a method of depositing a tungsten diffusion barrier having improved robustness.

It is a further object of the present invention to provide a method of depositing a tungsten diffusion barrier film which does not result in aluminum line extrusion.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming inter-level contacts between metal layers in a semiconductor device. The method comprises the steps of: (a) providing a semiconductor substrate having a surface; (b) providing at least one level of interconnect on the surface of the substrate; (c) depositing an insulator layer on the substrate; (d) opening a plurality of interconnect vias in the insulator layer to expose a portion of at least one level of interconnect; (e) placing the substrate into a sputter chamber having a tungsten target; and (f) non-collimated sputter depositing a tungsten film such that the sputtered tungsten film is in contact with at least one level of interconnect. Preferably, the non-collimated sputtered tungsten film has a thickness of about 200 Å to about 1000 Å.

The sputter chamber has a pressure of about 1 mTorr to about 10 mTorr. The inert gas flow inside the chamber, preferably nitrogen or argon, is at least 25 cm$^3$/min. to about 150 cm$^3$/min. Shielding inside the sputter chamber is coated with a material that promotes adhesion of tungsten to the shielding. Preferably, the material coating the shielding is aluminum oxide.

The present method may further include the step of depositing by CVD sufficient tungsten to fill all of the vias forming the via stud. The step of depositing an adhesion layer prior to depositing the tungsten film can also be included. Preferably, the adhesion layer is a titanium film having a thickness of about 0 Å to about 500 Å.

Utilizing non-collimated sputter depositing increases the target to substrate distance inside the sputter chamber than collimated sputter depositing. Non-collimated sputtering reduces the heating effect of traditional collimated sputtering reducing extrusion of metal wires. In addition, non-collimated sputtering provides lower via resistance than collimated sputtering.

In another aspect, the present invention relates to a method of fabricating an integrated circuit. The method comprises the steps of: (a) patterning a dielectric layer to form vias which expose the underlying material, the exposed underlying material comprises an electrically conducting material; (b) depositing an adhesion film into the via; and (c) non-collimated sputter depositing a tungsten film covering the adhesion film in the via.

The step of non-collimated sputter depositing the tungsten film occurs in a sputter chamber containing shielding coated with a material, preferably, aluminum oxide, that promotes adhesion of tungsten to the shielding. The chamber pressure is about 1 mTorr to about 10 mTorr with an inert gas flow of at least 25 cm$^3$/min. to about 150 cm$^3$/min. The adhesion film is selected from the group consisting of titanium, and titanium-tungsten alloy. Preferably, the sputter deposited tungsten film has a thickness of about 200 Å to about 1000 Å.

In yet another aspect, the present invention relates to a method of sputtering tungsten to form a diffusion barrier in inter-level vias. The method comprises the steps of: (a) providing a substrate having a patterned dielectric layer with vias exposing an underlying electrically conductive material; (b) placing the substrate in a sputtering chamber having a tungsten target; (c) allowing direct unimpeded access from the target to the substrate; and (d) sputter depositing a tungsten film into the via.

Utilizing the above method, during sputter depositing the tungsten film, material sputtered from the tungsten target does not pass through a collimator. The sputter chamber contains shielding coated with a material, preferably, aluminum oxide, that promotes adhesion of tungsten to the shielding. Chamber pressure is about 1 mTorr to about 10 mTorr with an inert gas flow of at least 25 cm$^3$/min. to about 150 cm$^3$/min.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
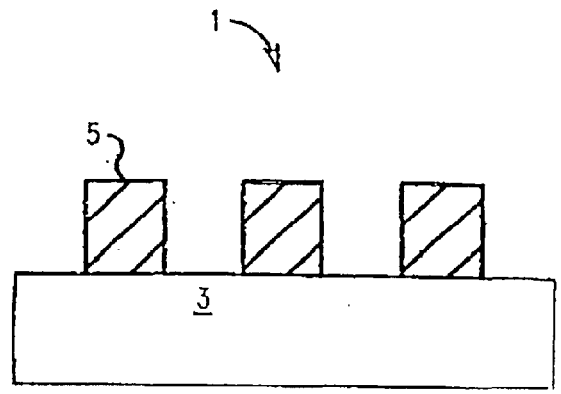
FIGS. 1 to 5 are elevational cross-sectional views of the sequence of steps for forming inter-level vias in semiconductor devices utilizing a method of the present invention.

In describing the preferred embodiment of the present invention, reference will be made herein to FIGS. 1–6 of the drawings in which like numerals refer to like features of the invention. Features of the invention are not necessarily shown to scale in the drawings.

In FIG. 1, semiconductor device 1 has a substrate 3 shown with multiple metal lines 5 formed on its surface. Substrate 3, typically made of silicon, not only includes metal lines 5 as shown. It may also include a plurality of dielectric and conductive layers, such as silicon oxide or nitride, as are necessary to form active devices on a semiconductor substrate. Metal lines are typically low resistivity metals such as aluminum or copper, and their binary and tertiary alloys. They are generally deposited using physical vapor deposition, patterned, and etched to produce the desired circuitry. The metal lines 5 can also be connected to an electrically active device in substrate 3 (not shown).

Figure 2:
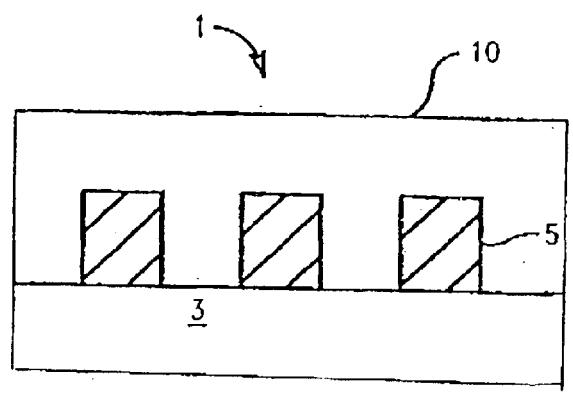

FIG. 2 shows continued processing of semiconductor device 1 after deposition of insulator layer 10 over the metal lines 5. An example of an insulator layer is silicon oxide which can be deposited by any conventional means. The silicon oxide can be planarized using CMP to form the insulating layer between the current and subsequent wiring levels or metallization levels. The insulator layer passivates or protects the metallization layer and is later etched to provide selective access to the metallization layer as discussed below.

Figure 3:
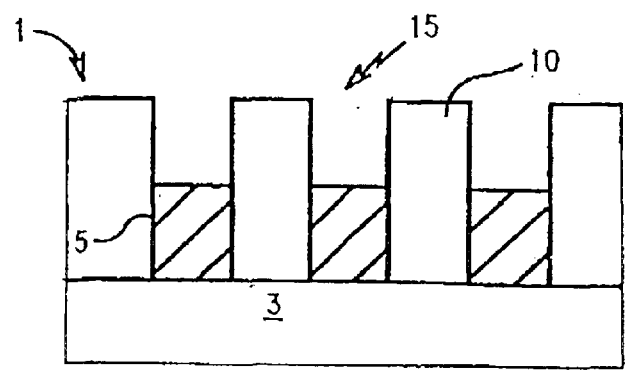

A resist layer is applied, patterned, and etched to expose those areas on the insulator layer where vias are desired to connect to the metal lines 5. Vias 15 are patterned and etched into insulating layer 10 exposing the top portion of metal lines 5 as shown in FIG. 3. Methods of patterning and etching the insulating layer are known in the art.

Figure 4:
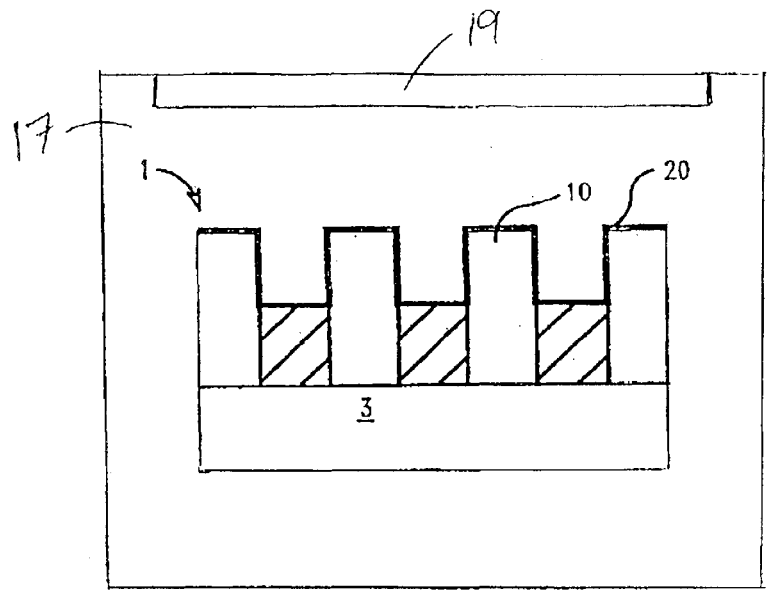

In FIG. 4, the tungsten film 20 is deposited into vias 15 by non-collimated sputtering, forming a robust barrier to the CVD-W chemistry used in making the via stud. Prior art sputtering techniques employed a collimator to reduce scattering of the tungsten increasing step coverage. The non-collimated sputtered tungsten film of the present invention can be deposited using an Applied Materials ENDURA 5500 HP sputtering system. The tungsten chamber is configured for collimated sputter deposition, however, the collimator is not placed in the chamber. Chamber pressure is about 6.5 mTorr with the power set at about 1.3 kilowatts. The target to substrate spacing is about 100 mm, a shorter distance than in collimated sputtering. The shortened target to substrate distance aids in achieving the step coverage needed without the heat effects of collimated sputtering. The tungsten target has a purity of 99.999% and low gas content. Preferably, the deposited tungsten film has a thickness of about 200 Å to about 1000 Å, most preferably, at about 660 Å.

The tungsten film acts as a diffusion barrier protecting the metal wiring from chemicals used during chemical vapor deposition of tungsten when forming the via stud. An adhesion film may be deposited into the via prior to depositing tungsten film 20 to promote adhesion of the tungsten to the insulating layer. The adhesion layer may comprise of titanium or a titanium-tungsten alloy having a thickness of about 150 Å when deposited by collimated sputter deposition or a thickness of about 125 Å when using ionized metal plasma deposition.

Figure 5:
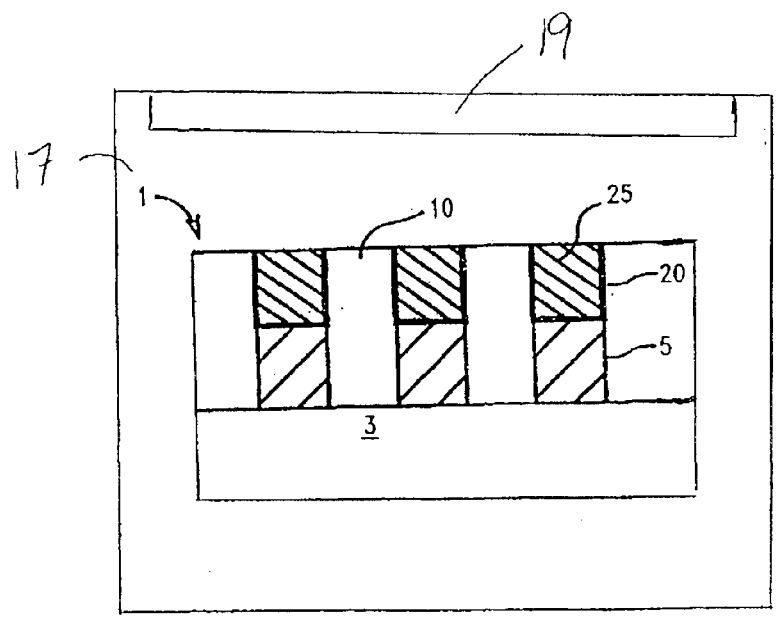

FIG. 5 shows the CVD-W deposited in the vias 15 under conditions known in the art. CVD provides a blanket deposition of the tungsten over the insulator layer 10. Excess tungsten is removed leaving tungsten only in the vias 15. The CVD-W forms an interconnect between the metal wiring below and the wiring to be built above the via. The surface of the semiconductor device 1 is planarized using common planarization techniques such as chemical mechanical polishing for ease of further processing. Further processing may include depositing a conductive metal layer over the planarized insulating layer.

Figure 6:
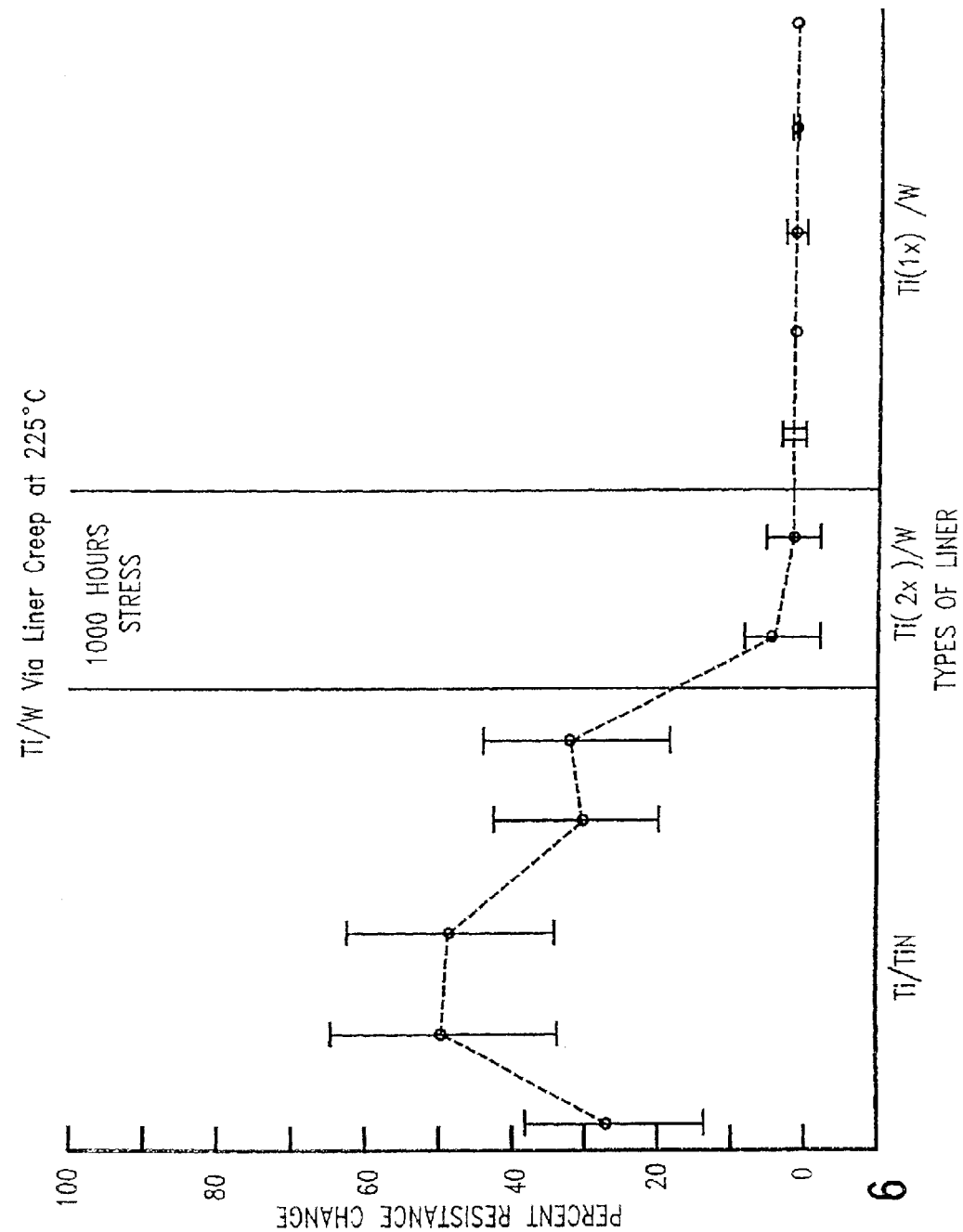
FIG. 6 shows the increased robustness of diffusion barrier liners using the tungsten films of the present invention. Creep stress comparisons in the percent increase in via resistance are shown for the prior art titanium/titanium nitride (Ti/TiN) diffusion barrier films in comparison with the titanium/tungsten (Ti/W) diffusion barrier films of the present invention.

FIG. 6 shows a comparison of creep stress results of a Ti/TiN film with two Ti/W films in 0.45 μm vias. The Ti/W films utilized two Ti thickness splits, Ti(1X) and Ti(2X) with a constant tungsten thickness. The graph shows the percent increase in via resistance by semiconductor wafer after 1000 hours of stress on metal creep structures. The structures were baked at 250° C. for 1000 hours, with periodic readouts of via resistance.

After 1000 hours of stress, results unexpectedly show that a Ti/W film is more reliable for metal creep, thus, more robust. As shown in FIG. 6, the Ti/TiN film shows unstable resistance changes ranging from a low of about 27% to a high of about 50%. The Ti/W films show only minor resistance changes. In particular, the resistance changes in the Ti(1X)/W film are quite minimal showing almost no resistance changes after five readouts during the stressing time.

In experiments varying the Ti/W film thickness, there may be an upper limit for titanium thickness at the bottom of the via, above which no benefits in resistance or reliability are observed. Reliability of Ti/W liners degraded with increasing Ti thickness, but was generally unaffected by tungsten thickness above a certain limit. This phenomena is evident in comparing the two different Ti/W films. In FIG. 6, the Ti(1X)/W film is more robust in comparison with the Ti(2X)/W film having greatly diminished resistance changes whereas the Ti(2X)/W film still exhibits some minor resistance changes on the order of about 1 to 5%.

The above invention achieves the objects recited above. The present invention provides a method of sputter depositing a tungsten diffusion barrier film without employing excessively high temperatures. The increased tungsten target to substrate distance within the sputter chamber in the absence of a collimator provides good step coverage of the via while departing from the heating effects of traditional collimated sputtering. During non-collimated sputtering the temperature in the sputter chamber is less than 420° C., thus, decreasing the incidence of aluminum line extrusion. Diffusion barrier films deposited according to the method of the present invention show an unexpected advantage in lowered resistance changes which translate into increased robustness.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of sputtering a tungsten film to form a robust diffusion barrier in inter-level vias comprising the steps of:
   (a) providing a substrate having a patterned dielectric layer with vias exposing a portion of an underlying electrically conductive material;
   (b) placing said substrate in a sputtering chamber having a tungsten target;
   (c) allowing direct unimpeded access from said target to said substrate; and
   (d) non-collimated sputter depositing an elemental tungsten film into said vias on side walls and a bottom of said via such that the sputtered tungsten film is in contact with said portion of said underlying electrically conductive material to form said robust diffusion barrier within said via and thereby protect said underlying electrically conductive material during a subsequent step of filling said vias by a chemical vapor deposition process.

2. The method according to claim 1, wherein the step of non-collimated sputter depositing said tungsten film occurs in a sputter chamber containing shielding coated with a material to promote adhesion of the tungsten to the shielding at a pressure of about 1 mTorr to about 10 mTorr, said step of non-collimated sputter depositing said tungsten film further including flowing an inert gas into said sputter chamber.

3. The method of claim 1, wherein the non-collimated sputter deposited tungsten film has a thickness of about 200 Å to about 1000 Å.

4. The method of claim 1 wherein said sputter chamber has a pressure of about 1 to about 10 mTorr.

5. The method of claim 1, further including flowing an inert gas flow into said sputter chamber.

6. The method of claim 1, further including the step of depositing by chemical vapor deposition sufficient tungsten to fill all of said vias.

7. The method of claim 1, wherein the non-collimated sputter depositing has a target to substrate distance of about 100 mm.

8. The method of claim 1, wherein the step of non-collimated sputtering the temperature in the sputtering chamber is less than 420° C., thereby reducing extrusion of metal wires.

9. The method of claim 1, further including the step of depositing an adhesion layer prior to depositing said tungsten film.

10. The method of claim 9, wherein said adhesion layer comprises a titanium film having a thickness of about 0 Å to about 500 Å.

11. A method of sputtering a tungsten film to form a robust diffusion barrier in inter-level vias comprising the steps of:
   (a) providing a substrate having a patterned dielectric layer with vias exposing a portion of an underlying electrically conductive material;
   (b) placing said substrate in a sputtering chamber having a tungsten target;
   (c) allowing direct unimpeded access from said target to said substrate; and
   (d) non-collimated sputter depositing an elemental tungsten film into said via on side walls and a bottom of said via such that the sputtered tungsten film is in contact with said portion of said underlying electrically conductive material to form said robust diffusion barrier within said via and thereby protect said underlying electrically conductive material during a subsequent step of filling said vias by a chemical vapor deposition process, said step of non-collimated sputter depositing occurring in a sputter chamber containing shielding coated with an aluminum oxide to promote adhesion of the tungsten to the shielding at a pressure of about 1 mTorr to about 10 mTorr and an inert gas flown into said sputter chamber.

12. A method of sputtering a tungsten film to form a diffusion barrier in inter-level vias comprising the steps of:
   (a) providing a substrate having a patterned dielectric layer with vias exposing a portion of an underlying electrically conductive material;
   (b) placing said substrate in a sputtering chamber having a tungsten target, said sputter chamber contains shielding coated with aluminum oxide to promote adhesion of the tungsten to the shielding;
   (c) allowing direct unimpeded access from said target to said substrate; and
   (d) non-collimated sputter depositing a tungsten film into said via on side walls and a bottom of said via such that the sputtered tungsten film is in contact with said portion of said underlying electrically conductive material to form said diffusion barrier within said via and thereby protect said underlying electrically conductive material during a subsequent step of depositing sufficient tungsten to fill said vias.

13. The method of claim 12, wherein the non-collimated sputter depositing has a target to substrate distance of about 100 mm.

14. The method of claim 12, wherein the step of non-collimated sputtering the temperature in the sputtering chamber is less than 420° C., thereby reducing extrusion of metal wires.

15. The method of claim 12, wherein said sputter chamber has a pressure of about 1 to about 10 mTorr.

16. The method of claim 12, further including flowing an inert gas into said sputter chamber.

17. A method of sputtering a tungsten film to form a diffusion barrier in inter-level vias comprising the steps of:

(a) providing a substrate having a patterned dielectric layer with vias exposing a portion of an underlying electrically conductive material;

(b) placing said substrate in a sputtering chamber having a tungsten target, said non-collimated sputter depositing has a target to substrate distance of about 100 mm, said sputtering chamber containing shielding coated with a aluminum oxide to promote adhesion of tungsten to the shielding at a pressure of about 1 mTorr to about 10 mTorr, and an inert gas flow;

(c) allowing direct unimpeded access from said target to said substrate; and (d) non-collimator sputter depositing a tungsten film into said via on side walls and a bottom of said via in said sputtering chamber such that the sputtered tungsten film is in contact with said portion of said underlying electrically conductive material to form said diffusion barrier within said via and thereby protect said underlying electrically conductive material during a subsequent step of chemical vapor deposition of sufficient tungsten to fill said vias.

* * * * *